(12) United States Patent
Tsuchiya et al.

(10) Patent No.: US 7,425,814 B2
(45) Date of Patent: Sep. 16, 2008

(54) BATTERY PACK AND REMAINING BATTERY POWER CALCULATION METHOD

(75) Inventors: Yukio Tsuchiya, Kanagawa (JP); Hideyuki Sato, Chiba (JP); Kazuyasu Nawa, Tokyo (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 10/983,396

(22) Filed: Nov. 8, 2004

(65) Prior Publication Data

US 2005/0189919 A1 Sep. 1, 2005

(30) Foreign Application Priority Data

Nov. 14, 2003 (JP) .............. 2003-384672

(51) Int. Cl.
*H02J 7/00* (2006.01)
(52) U.S. Cl. ..................... 320/132; 320/110
(58) Field of Classification Search ............... 320/132, 320/112, 133, 110
See application file for complete search history.

(56) References Cited

U.S. PATENT DOCUMENTS

| | | | |
|---|---|---|---|
| 5,912,548 A | 6/1999 | Downs et al. | |
| 6,137,269 A | 10/2000 | Champlin | |
| 6,157,169 A * | 12/2000 | Lee | 320/132 |
| 6,211,644 B1 * | 4/2001 | Wendelrup et al. | 320/106 |
| 2003/0188204 A1 * | 10/2003 | Tashiro et al. | 713/300 |
| 2003/0193318 A1 | 10/2003 | Ozawa et al. | |

FOREIGN PATENT DOCUMENTS

| | | |
|---|---|---|
| DE | 101 34 065 | 1/2003 |
| EP | 0 560 468 | 5/2000 |
| EP | 1 503 219 | 2/2005 |

OTHER PUBLICATIONS

Derwent Abstract Accession No. 2003-234981/23, JP 2003-051341 A (Nissan Motor Co Ltd) Feb. 21, 2003.
Derwent Abstract Accession No. 2001-348390/37, JP 2001-076769 A (Toyoda Jodosha KK) Mar. 23, 2001.
Derwent Abstract Accession No. 2003-240862/24, DE 10134065 A (VB Autobatterie GMBH) Jan. 23, 2003 & DE 10134065 A.

* cited by examiner

*Primary Examiner*—Gary L Laxton
*Assistant Examiner*—Yalkew Fantu
(74) *Attorney, Agent, or Firm*—Frommer Lawrence & Haug LLP; William S. Frommer; Thomas F. Presson

(57) ABSTRACT

The temperature of a battery cell measured by a temperature measurement means is stored into a measured temperature history storage means for storing a history of temperature. An in-cell temperature inference means extracts a minimum temperature from the history of a predetermined time from the measured temperature history storage means, and infers the minimum temperature as a current temperature within the battery cell. A remaining power calculation means calculates remaining battery power based on the inferred temperature within the battery cell. Instead of directly using the measured temperature for the calculation of the remaining battery power, the inferred temperature within the battery cell is used, whereby even if the measured temperature rises rapidly, it is possible to prevent the phenomenon instantaneous increase of the calculated remaining battery power.

4 Claims, 6 Drawing Sheets

BATTERY PACK AND REMAINING BATTERY POWER CALCULATION METHOD

CROSS REFERENCES TO RELATED APPLICATIONS

The present document is based on Japanese Priority Document JP2003-384672, filed to the Japanese Patent Office on Nov. 14, 2003, the entire contents of which being incorporated herein by reference to the extent permitted by law.

BACKGROUND OF THE INVENTION

1. Field of the Invention

The present invention relates to a battery pack and a remaining battery power calculation method, and more particularly, to a battery pack and a remaining battery power calculation method capable of calculating remaining battery power according to the temperature of the battery pack during use.

2. Related Art

Battery packs (secondary batteries) such as liquid ion batteries have specific capacities, and their capacities have the characteristic of varying according to the temperature under which the battery pack is used.

When a battery pack is used under low temperature, the internal impedance of its battery cell increases and when the same current as normal temperature is applied, a large voltage drop occurs, so that the capacity of the battery pack decreases.

FIG. 6 is a graph showing discharge characteristics of a battery pack at 25° C., 10° C. and 0° C. The abscissa represents time, while the ordinate represents voltage.

As shown in FIG. 6, in the case of discharge of 2.0 W and end voltage of 3.35 V, the following measurement result is obtained: if a dischargeable capacity in an environment of 25° C. is set to 100%, for example, the measurement shows approximately 80% dischargeable capacity under an environment of 10° C. and approximately 60% dischargeable capacity under an environment of 0° C.

The technique of detecting the temperature of a battery pack by using a temperature sensor and correcting the remaining battery power has heretofore been used to correct battery capacity diminutions during use at low temperatures, like described in Japanese Laid-Open Patent Application JP-A-2000-260488 (Paragraph Numbers [0038]-[0072]).

In this case, the current thermistor temperature is measured to correct a usable time in the current temperature environment. Accordingly, in environments of lower temperature, displayed usable time tends to become shorter.

SUMMARY OF THE INVENTION

However, since it is difficult to mount a thermistor within a battery cell, the conventional technique using a thermistor merely makes it possible to measure the temperature of a circuit board of a battery pack or the surface temperature thereof. The actual decrease of battery capacity depends on the internal temperature of the battery cells (the temperatures of electrodes disposed within the battery cells). Accordingly, conventional technologies have a problem not to be able to carry out accurate correction.

In addition, in recent years, the trends has been toward downsizing of camcorders and digital still cameras having batteries, and the number of devices using built-in batteries or batteries accommodated inside has increased. In general, this type of device generates heat during use, and this heat has the influence of increasing the surface temperature of its battery pack. However, at this point in time, the temperature of its thermistor only is increased, but the internal temperature of its battery cell is not yet increased. In addition, the battery's usable capacity also remains decreased.

In other words, if the utilization of the battery is started at a low temperature, the temperature of the thermistor increases, and displayed remaining power also increases. However, if the inside of the battery is not yet warmed, an error occurs between the calculated remaining battery power and an actually usable capacity.

The present invention has been conceived in view of the above-mentioned problems, and an object of the present invention is to provide a battery pack and a remaining battery power calculation method that can reduce calculation error of remaining battery power.

According to a preferred embodiment of the present invention, there is provided a battery pack capable of calculating remaining battery power according to the temperature of the battery pack in use, characterized by a temperature measurement means for measuring a temperature of a battery cell, a measured temperature history storage means for storing a history of the measured temperature, an in-cell temperature inference means for extracting a minimum temperature from the history of a predetermined time and inferring the minimum temperature as a current temperature within the battery cell, and a remaining power calculation means for calculating remaining battery power based on the inferred temperature within the battery cell.

According to this construction, the temperature of the battery cell measured by the temperature measurement means is stored into the measured temperature history storage means for storing a history of temperature. The temperature inference means extracts a minimum temperature from the history of the predetermined time from the measured temperature history storage means, and infers the minimum temperature as a current temperature within the battery cell. The remaining power calculation means calculates remaining battery power based on the inferred temperature within the battery cell. Instead of directly using the measured temperature for the calculation of the remaining battery power, the inferred temperature within the battery cell is used, whereby even if the measured temperature rises rapidly, it is possible to prevent the phenomenon instantaneous increase of the calculated remaining battery power.

In the battery pack according to a preferred embodiment of the present invention, instead of directly using the measured temperature for the calculation of the remaining battery power, the minimum temperature is extracted from the history of the predetermined time and is inferred as an temperature within the battery cell, and the inferred temperature within the battery cell is used for the calculation of the remaining battery power. Accordingly, even if the measured temperature rises rapidly, it is possible to prevent the phenomenon of instantaneous increase of the calculated remaining battery power.

The present invention can be applied to battery packs to be connected to, for example, video cameras, digital still cameras or battery chargers, and the like.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS OF THE PRESENT INVENTION

A preferred embodiment of the present invention will be described below in detail with reference to the accompanying drawings.

Figure 1:
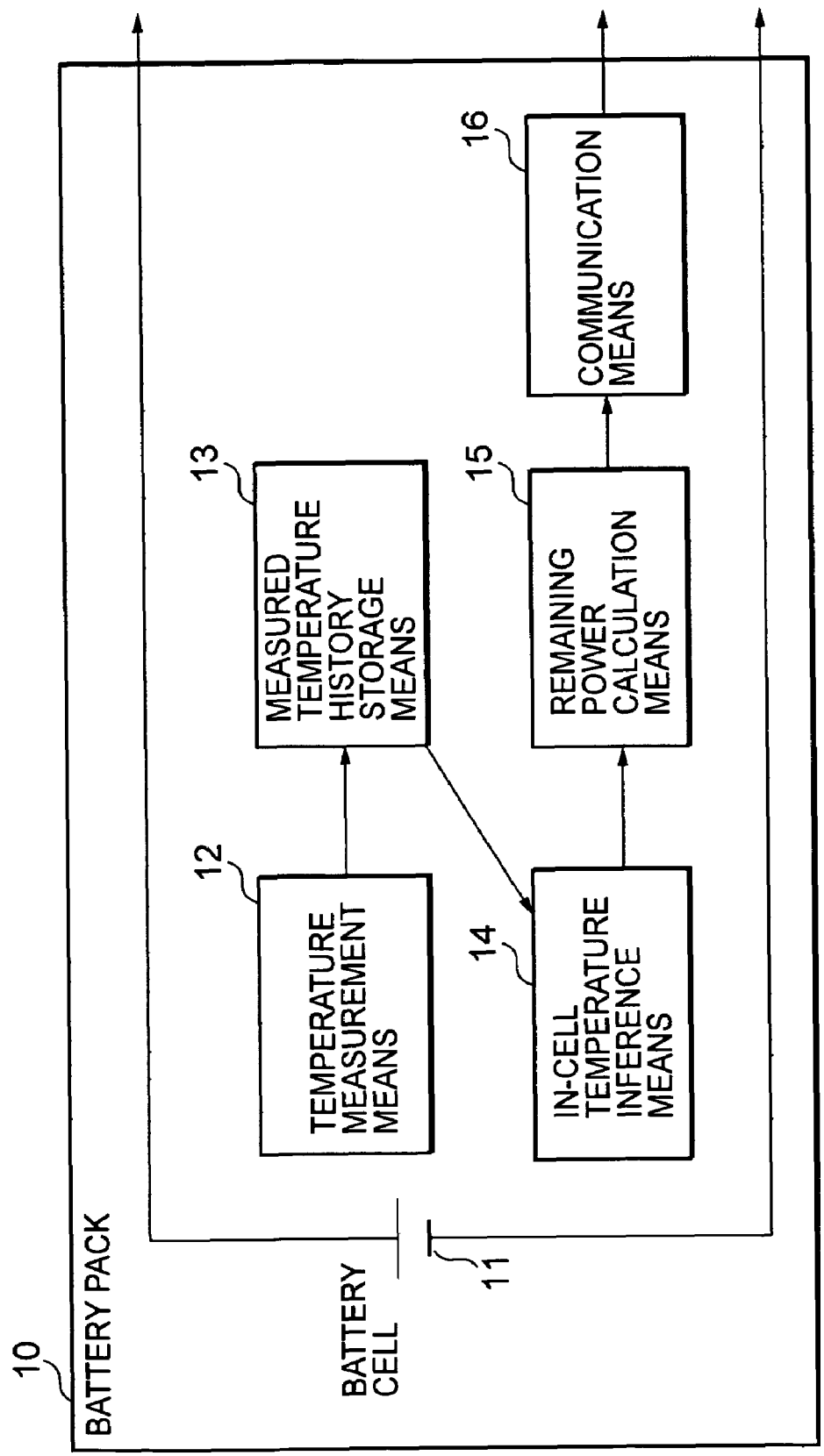
FIG. 1 shows a functional block diagram of the principle of operation a battery pack according to a preferred embodiment of the present invention.

FIG. 1 is a functional block diagram showing the principle of a battery pack according to the preferred embodiment of the present invention.

A battery pack 10 according to a preferred embodiment of the present invention includes temperature measurement means 12 for measuring the temperature of a battery cell, measured temperature history storage means 13 for storing the history of the measured temperature, in-cell temperature inference means 14 for extracting a minimum temperature from a history of a predetermined time and inferring the minimum temperature as a current temperature within the battery cell, remaining power calculation means 15 for calculating remaining battery power based on the inferred temperature within the battery cell, and communication means 16 for communicating the calculated remaining battery power amount to a connected device which is not shown.

The battery cell 11 is, for example, a lithium ion battery. The temperature measurement means 12 is, for example, a thermistor which is mounted on a surface of the battery cell or a circuit board. The measured temperature history storage means 13 is, for example, an EEPROM (Electrically Erasable Programmable Read-Only Memory). The in-cell temperature inference means 14 and the remaining power calculation means 15 are realized by, for example, a microcontroller.

The predetermined time is defined by the time until which the temperature within the battery cell reaches a temperature measured at a certain point in time, for example, by the thermistor, and depends on the thermal voltage characteristic of the battery cell 11 or a position in the battery pack 10 where the thermistor which constitutes the temperature measurement means 12 is disposed.

An operation of the battery pack 10 will be described below.

When the battery pack 10 is used connected to a device such as a video camera or a digital still camera, for example, the temperature of the battery cell 11 is measured by the temperature measurement means 12. At the beginning of operation, either the temperature of the surface of the battery cell 11 or the temperature in the battery pack 10 is measured. This measured temperature is stored in the measured temperature history storage means 13. The in-cell temperature inference means 14 extracts a minimum temperature from the history of the measured temperature of the predetermined time from the measured temperature history storage means 13, and infers the minimum temperature as a current temperature within the battery cell. The remaining power calculation means 15 calculates remaining battery power based on the inferred temperature within the battery cell. The communication means 16 communicates the remaining battery power amount which has been calculated so that a usable remaining time can be displayed on the connected device such as a video camera or a digital still camera.

In this manner, instead of directly using the measured temperature for the calculation of the remaining battery power, the inferred temperature within the battery cell is used, whereby, even if the measured temperature rises rapidly, it is possible to prevent the phenomenon instantaneous increase of the calculated remaining battery power.

Details of a preferred embodiment of the present invention will be described below.

Figure 2:
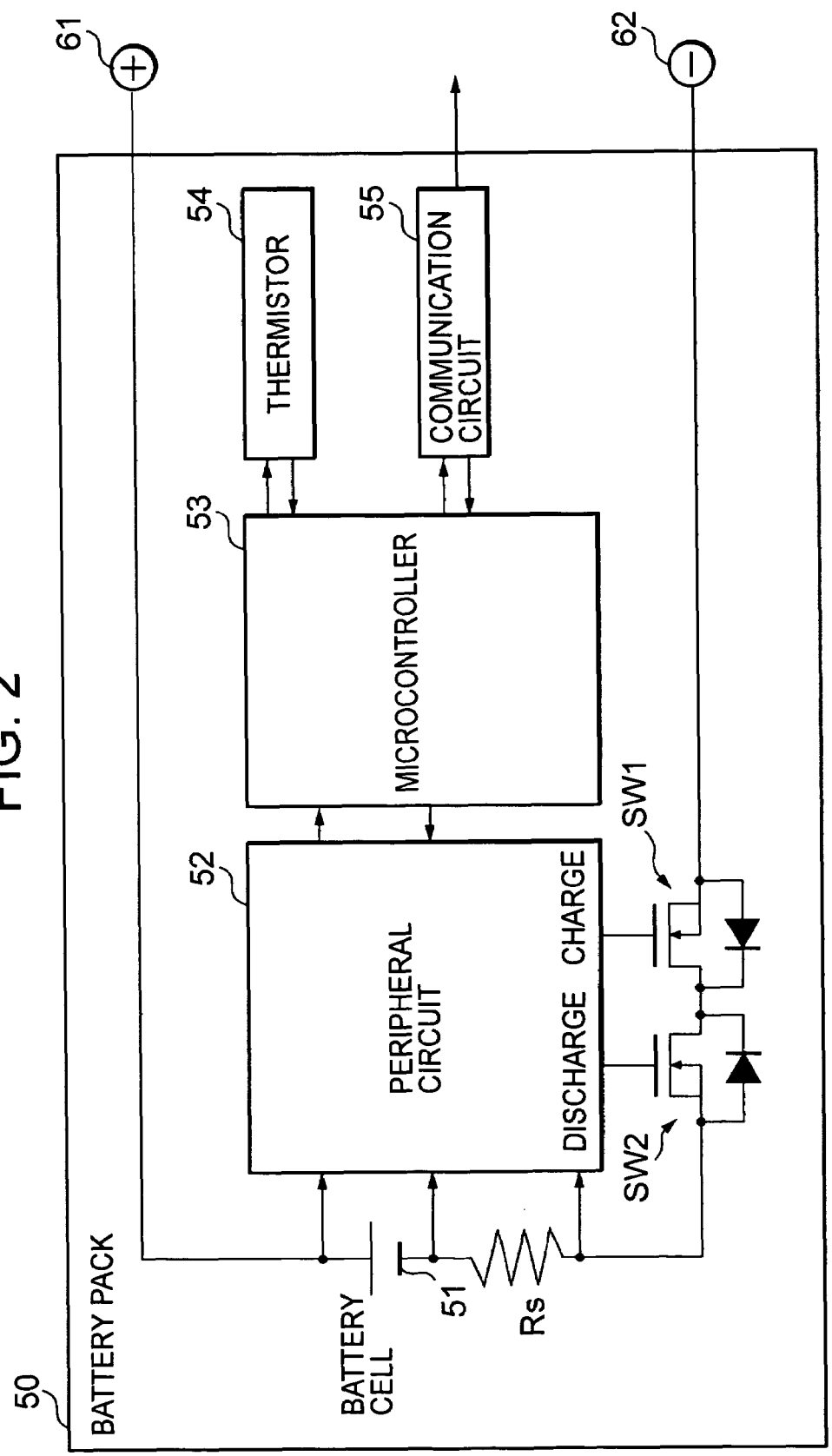
FIG. 2 shows an example of hardware configuration of a battery pack according to a preferred embodiment of the present invention.

FIG. 2 shows a hardware configuration example of a battery pack according to a preferred embodiment of the present invention.

A battery pack 50 includes a battery cell 51, a peripheral circuit 52, a microcontroller 53, a thermistor 54, and a communication circuit 55.

The battery cell 51 is, for example, a lithium ion battery, a nickel-metal hydride battery, or a lithium polymer battery.

The positive electrode of the battery cell 51 is connected to a positive terminal 61, while the negative electrode of the battery cell 51 is connected to a negative terminal 62 via a current detection resistor Rs as well as a charge control switch SW1 and a discharge control switch SW2 each made of a power MOSFET (Metal-Oxide-Semiconductor Field Effect Transistor) and a diode.

The peripheral circuit 52 has a circuit construction mainly made of a voltage comparator (comparator), and has the function of detecting a charge/discharge current value flowing through the current detection resistor Rs, and the protection function of protecting the battery cell 51 from overcharge, over discharge and over current. Specifically, if the voltage of the battery cell 51 becomes equal to or higher than a set voltage, the peripheral circuit 52 turns off the charge control switch SW1 to stop charging, thereby preventing overcharge. On the other hand, if the voltage of the battery cell 51 becomes lower than a set voltage, the peripheral circuit 52 turns off the discharge control switch SW2 to stop discharging, thereby preventing over discharge.

The microcontroller 53 cumulatively sums charge/discharge currents detected by the peripheral circuit 52, and calculates the remaining battery power according to the temperature of the battery pack 50 in use. In addition, the microcontroller 53 controls the thermistor 54, and has, as measured temperature history storage means for storing the history of temperatures measured by the thermistor 54, for example, an EEPROM in a built-in form. The microcontroller 53 also has the function of controlling the communication circuit 55 to communicate the calculated remaining battery power amount to a connected device.

The operation of the battery pack 50 will be described below.

For example, if the battery pack 50, the positive terminal 61 and the negative terminal 62 of which are connected to a device such as a video camera or a digital still camera, starts to be used, the microcontroller 53 cumulatively sums charge/discharge current values detected by the peripheral circuit 52, and calculates the remaining battery power. At this time, the microcontroller 53 corrects the remaining battery power based on a temperature measured by the thermistor 54.

Figure 3:
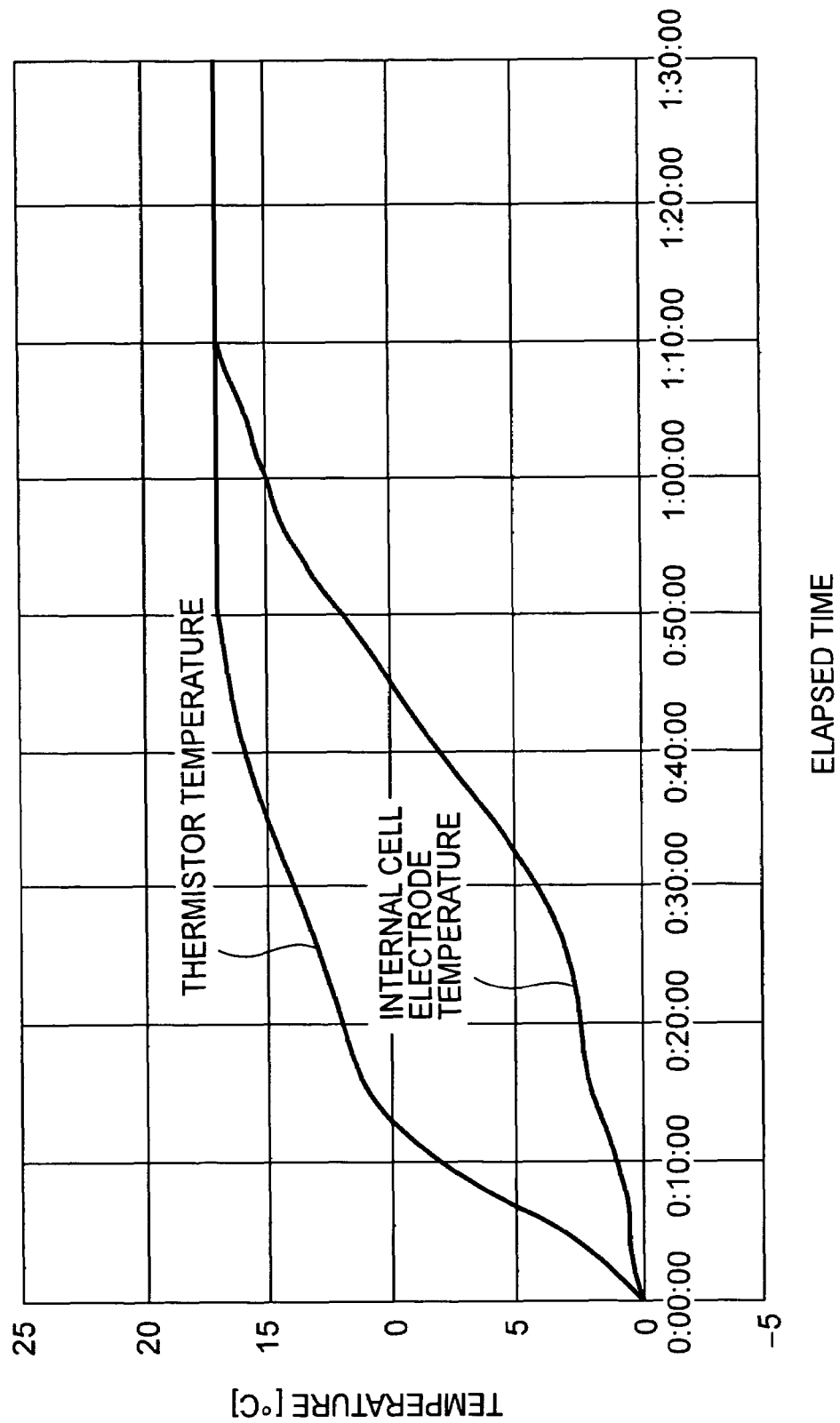
FIG. 3 shows a graph of an example of the relationship between thermistor temperature and in-battery-cell (internal cell electrode) temperature.

FIG. 3 shows a graph of an example of the relationship between thermistor temperature and in-battery-cell (internal cell electrode) temperature during the use of the battery pack.

The abscissa represents elapsed time, while the ordinate represents temperature [° C.].

As shown in FIG. 3, the internal cell electrode temperature exhibits a characteristic of not rising immediately when the thermistor temperature rises, and reaching a thermistor temperature measured at a certain point in time after lapse of a certain amount of time. In this example, when approximately 24 minutes is elapsed, the internal cell electrode temperature exhibits a value close to the thermistor temperature.

In the battery pack 50 according to a preferred embodiment of the present invention, the temperatures measured by the thermistor 54 are stored in a RAM or an EEPROM (which is not shown) of the microcontroller 53. If the currently measured temperature is not a minimum temperature in the history of the predetermined time which is stored in the EEPROM, the microcontroller 53 extracts a minimum temperature from the history and infers the minimum temperature as the current temperature within the battery cell. For example, in the case shown in FIG. 3, the microcontroller 53 extracts a minimum temperature from a history of 24 minutes, and infers the minimum temperature as the current temperature within the battery cell.

Figure 4:
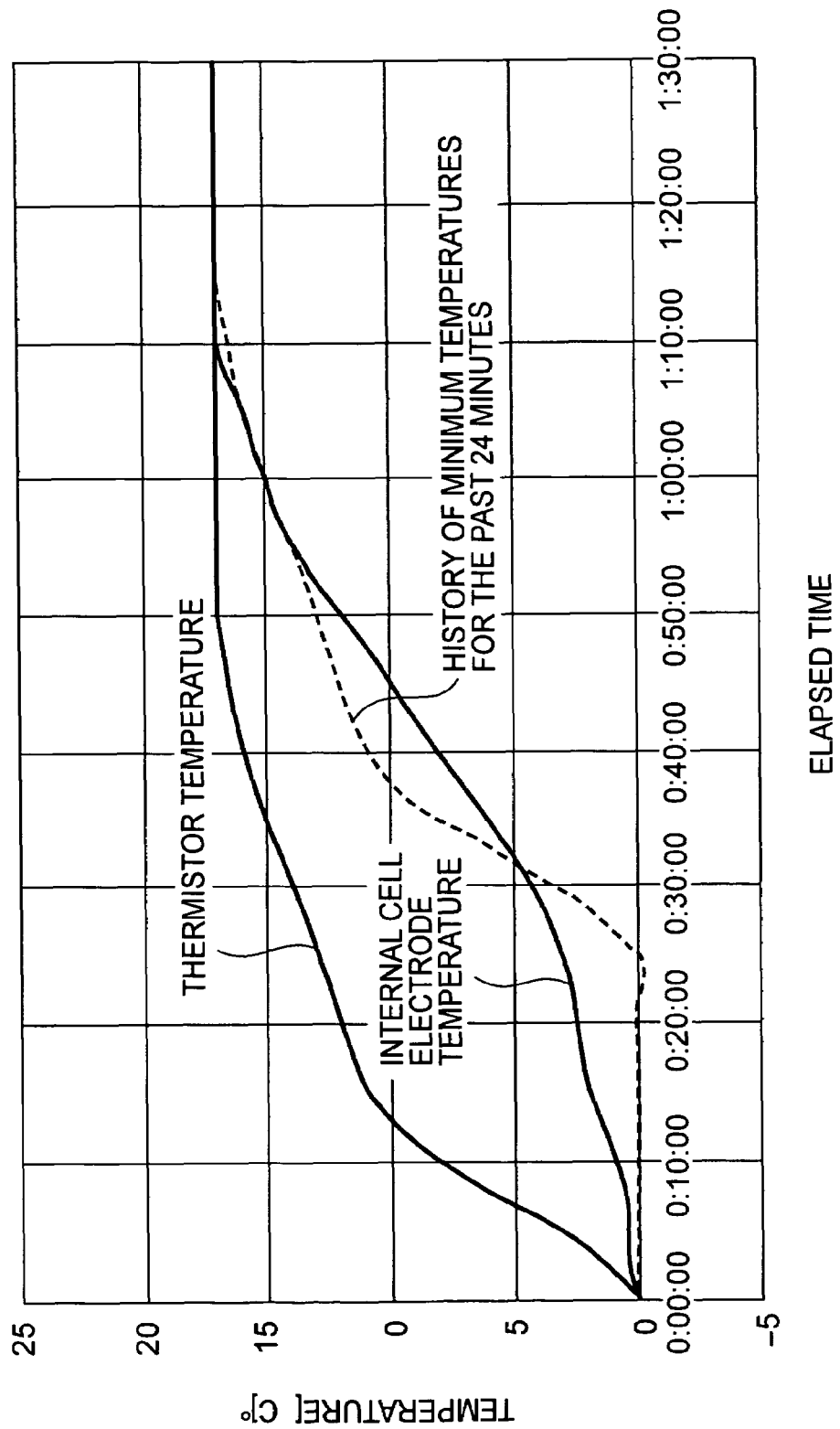
FIG. 4 shows a graph in which the history of minimum thermistor temperatures of the past 24 minutes is added to FIG. 3.

FIG. 4 shows a graph in which the history of minimum thermistor temperatures of past 24 minutes is added to FIG. 3.

The abscissa represents elapsed time, while the ordinate represents temperature [° C.].

As shown in FIG. 4, values near the internal cell electrode temperature can be obtained by plotting the history of minimum temperatures of the past 24 minutes.

The microcontroller 53 corrects, on the inferred temperature within the battery cell, the remaining battery power calculated by a cumulatively sum of current values detected by the peripheral circuit 52. The communication circuit 55 communicates the remaining battery power amount calculated in this manner to the connected device which is not shown, under the control of the microcontroller 53, whereby a video camera and a digital still camera, for example, can inform a user of a value near the time during which the battery pack 50 can discharge under the current environment.

In addition, even if the temperature of the thermistor rises due to a rapid temperature change, it is possible to avoid the problem that displayed remaining time increases instantaneously.

The processing of the battery pack according to a preferred embodiment of the present invention will be summarized below in the form of a flowchart.

Figure 5:
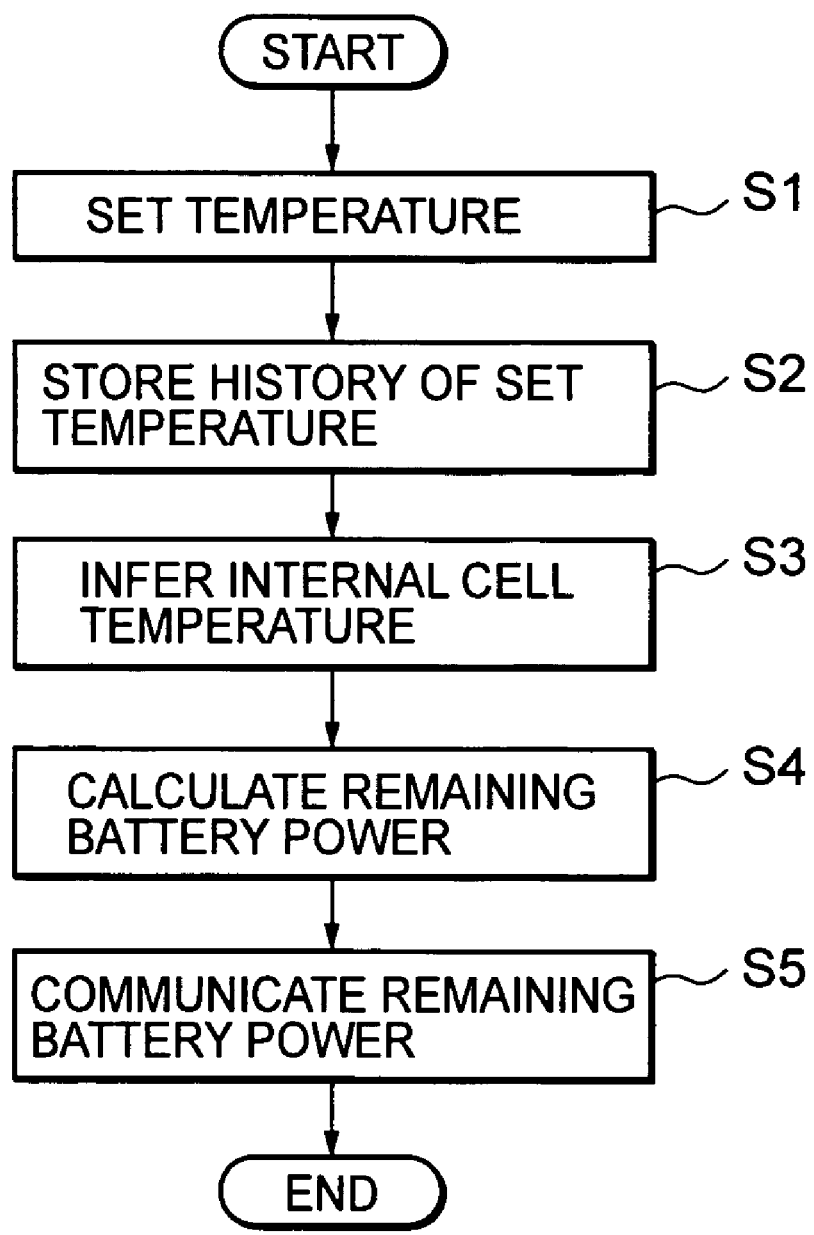
FIG. 5 shows a flowchart of a processing flow of the battery pack according to a preferred embodiment of the present invention.
Figure 6:
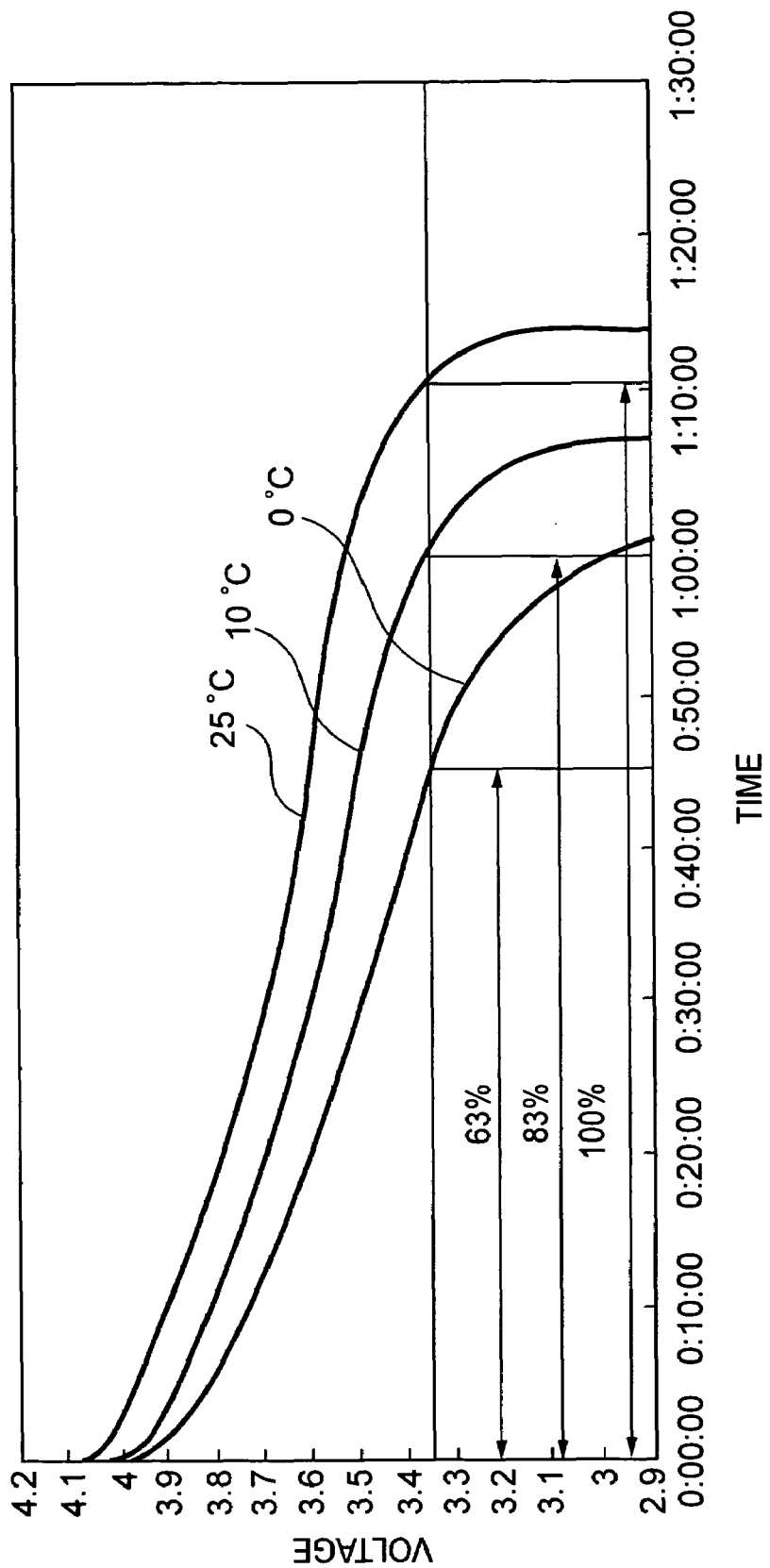
FIG. 6 shows a graph of discharge characteristics of a battery pack at 25° C., 10° C. and 0° C.

FIG. 5 is a flowchart showing the flow of the processing of the battery pack according to a preferred embodiment of the present invention.

Step S1: Temperature Measurement

The temperature of the battery cell 51 is measured by the thermistor 54.

Step S2: Storage of Measured Temperature History

The microcontroller 53 stores the history of the measured temperature into, for example, the EEPROM.

Step S3: Inference of Temperature Within Cell

The microcontroller 53 extracts a minimum temperature from the history of the predetermined time, and infers the minimum temperature as the current temperature within the battery cell.

It is to be noted that if the currently measured temperature is a minimum value in the history, the value is used as the temperature within the battery cell.

Step S4: Calculation of Remaining Battery Power

The microcontroller 53 calculates the remaining battery power by correcting, based on the inferred temperature within the battery cell, a value calculated by a cumulative sum of current values detected by the peripheral circuit 52.

Step S5: Communication of Remaining Battery Power

The microcontroller 53 controls the communication circuit 55 to communicate the calculated remaining battery power amount to the connected device, not shown in the figure.

In the above-mentioned embodiments of the present invention, a current temperature in the battery cell is inferred by holding the history of the past minimum temperatures, but the current temperature may be inferred by holding also the history of maximum temperatures or from temperature variations. Accordingly, the temperature in the battery cell can be inferred more accurately, and remaining time display can be made closer to an actual value.

The above-mentioned processing content can be realized by the software of the microcontroller 53 and therefore can be realized without cost increases compared to existing products.

It is to be observed that the present invention is not limited to the above-mentioned examples of preferred embodiments, which are merely descriptions of the present invention in its preferred form under a certain degree of particularity. They are by no means to be construed so as to limiting the scope of the present invention. Accordingly, it is to be understood by those of ordinary skill in the art that many other changes, variations, combinations, sub-combinations and the like are possible therein without departing from the scope and spirit of the present invention.

What is claimed is:

1. A battery pack capable of calculating remaining battery power according to temperature of the battery pack during use, comprising:
   temperature measurement means for measuring a temperature of a battery cell;
   measured temperature history storage means for storing a history of measured temperature;
   temperature inference means for extracting a minimum temperature from the history within a time interval, and setting the minimum temperature as a current temperature within the battery cell; and
   remaining power calculation means for calculating remaining battery power based on the set temperature within the battery cell.

2. The battery pack according to claim 1, wherein the time interval is determined according to time elapsed until the temperature within the battery cell reaches a temperature measured at a given instant.

3. The battery pack according to claim 1, further comprising notifying means for notifying the calculated remaining battery power amount to a connecting device.

4. A remaining power calculating method for calculating remaining battery power according to temperature of the battery pack during use, the method comprising the steps of:
   measuring a temperature of a battery cell;
   storing a history of measured temperature;
   extracting a minimum temperature from the history within a time interval, and setting the minimum temperature as a current temperature within the battery cell; and
   calculating the remaining battery power based on the set temperature within the battery cell.

* * * * *